(12) United States Patent
Howlett

(10) Patent No.: US 7,328,378 B2
(45) Date of Patent: Feb. 5, 2008

(54) REPAIR TECHNIQUES FOR MEMORY WITH MULTIPLE REDUNDANCY

(75) Inventor: Warren Kurt Howlett, Windsor, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/507,272

(22) Filed: Aug. 21, 2006

(65) Prior Publication Data

US 2007/0033491 A1 Feb. 8, 2007

Related U.S. Application Data

(62) Division of application No. 10/316,651, filed on Dec. 11, 2002, now Pat. No. 7,131,039.

(51) Int. Cl.
*G11C 29/00* (2006.01)

(52) U.S. Cl. .................................. 714/710; 714/758

(58) Field of Classification Search ................ 714/710, 714/758

See application file for complete search history.

(56) References Cited

U.S. PATENT DOCUMENTS 5,761,138 A * 6/1998 Lee et al. .................... 365/200
6,181,614 B1 * 1/2001 Aipperspach et al. ....... 365/200

* cited by examiner

*Primary Examiner*—Mujtaba K. Chaudry

(57) ABSTRACT

In one aspect, the present invention features techniques for generating a repair solution for a memory having a set of IOs including a plurality of main IOs and a plurality of redundant IOs. For example, techniques are provided for selecting a mapping between input/output ports of the memory and a subset of the memory's IOs. In particular, techniques are provided for configuring a plurality of multiplexors to implement the selected mapping by establishing electrical connections between the subset of IOs and the memory input/output ports. The subset of IOs may include one or more of the plurality of redundant IOs which effectively replace one or more defective ones of the main IOs. The plurality of multiplexors may be configured by generating one or more thermometer codes which encode the identities of any defective main IOs and which serve as selection inputs to the plurality of multiplexors.

13 Claims, 10 Drawing Sheets

REPAIR TECHNIQUES FOR MEMORY WITH MULTIPLE REDUNDANCY

CROSS REFERENCE TO RELATED APPLICATIONS

This application is a divisional of U.S. patent application Ser. No. 10/316,651, filed on Dec. 11, 2002 now U.S. Pat. No. 7,131,039, entitled "Repair Techniques for Memory with Multiple Redundancy," which is hereby incorporated by reference.

BACKGROUND

1. Field of the Invention

The present invention relates to digital memories and, more particularly, to techniques for repairing digital memories having multiple redundant elements.

2. Related Art

Integrated circuits are becoming increasingly small and densely packed. It is now possible, for example, to manufacture individual digital memory cells having an area of less than one square micron, and to pack hundreds or millions of transistors on a memory chip that is smaller than a dime. Due to uncontrollable variations in the manufacturing process, it is not possible to manufacture such memory chips perfectly. Any particular memory chip may include any number and variety of defects. For example, one or more memory cells on a chip may be defective and therefore be unable to store data reliably.

For a memory chip to be usable, however, the chip must be functionally indistinguishable from a chip having no defects. Because it is not possible to manufacture an actual defect-free chip, various techniques have been developed for automatically repairing defective chips so that they can provide the same functionality as a defect-free chip. Although it may not be possible to repair all defects in all chips, the ability to make even some chips usable by repairing them may increase the production yield of a particular batch of chips, thereby increasing the efficiency of the manufacturing process.

One technique that has been employed to repair chips is to provide redundant circuit elements on the chips that may be substituted for key circuit elements that prove to be defective. During testing of a chip, the defective portion of the circuit may be identified and the redundant circuit element, if one exists, may be activated by opening an associated fuse or similar mechanism. The redundant circuit element thereafter substitutes for and effectively replaces the original defective circuit element, thereby repairing the chip and making it usable. Redundancy is especially suited for repetitive circuits having a large number of repeating elements arranged in some form of array, such that a redundant circuit element can replace a single defective circuit element in a collection of circuit elements.

Memory chips are one example of such repetitive circuits. The memory in a memory chip is arranged in rows and columns. The redundant circuit element in such a chip may, for example, be a single memory cell, a row or collection of rows of memory cells, or a column or collection of columns of memory cells. If, for example, one cell in a given column is defective, the cell may be classified as defective. The defective cell, the column (or row) containing it, or the collection of columns (or rows) containing the defective cell may effectively be replaced by a redundant cell, row, column, or collection of rows or columns. In this way the chip may be made fully operational. Such repair makes it possible to use the memory chip reliably, thereby increasing the production yield by avoiding the need to discard the memory chip.

A memory "IO" is a combination input/output interface for transmitting data to and from a memory chip. A single IO may be connected to a particular array or sub-array of memory on the chip. For example, each IO on a chip may be connected to memory arrays each having 8 columns and 256 rows. If an individual cell, column, or row in an array coupled to a particular IO is defective, it may be possible to repair the individual cell, column, or row using conventional repair techniques. If conventional repair techniques fail, however, techniques also exist for repairing the IO itself by effectively replacing it with a redundant IO coupled to an entire redundant memory array.

Furthermore, the co-pending and commonly-owned patent application Ser. No. 09/919,091, entitled "A Data-Shifting Scheme for Utilizing Multiple Redundant Elements," filed on Jul. 31, 2001, Attorney Docket No. 10004359-1, discloses techniques for shifting cache input and output data so that such data are routed around as many as two defective cache IOs. The circuit elements (e.g., multiplexors) which perform such data shifting must be configured to route data around the particular cache IOs (if any) which are determined to be defective. It is desirable for such configuration to be performed automatically in response to identification of the particular cache IOs (if any) which are determined to be defective. Performing such configuration automatically and accurately for a wide variety of defects presents particular challenges given the variety of permutations in which zero, one, or two cache IOs may be defective and given the fact that it may not be possible to detect defective cache IOs with perfect accuracy.

What is needed, therefore, are techniques for configuring a cache to repair multiple defective IOs.

SUMMARY

In one aspect, the present invention features techniques for generating a repair solution for a memory having a set of IOs including a plurality of main IOs and a plurality of redundant IOs. For example, techniques are provided for selecting a mapping between input/output ports of the memory and a subset of the memory's IOs. In particular, techniques are provided for configuring a plurality of multiplexors to implement the selected mapping by establishing electrical connections between the subset of IOs and the memory input/output ports. The subset of IOs may include one or more of the plurality of redundant IOs which effectively replace one or more defective ones of the main IOs. The plurality of multiplexors may be configured by generating one or more thermometer codes which encode the identities of any defective main IOs and which serve as selection inputs to the plurality of multiplexors.

In another aspect, the present invention features an apparatus comprising: an electronic memory comprising a set of IOs, the set of IOs including a plurality of main IOs and a plurality of spare IOs; a plurality of input/output ports coupled to the electronic memory; selection means for selecting a mapping between the plurality of input/output ports and a subset of the set of IOs; and switching means coupled between the set of IOs and the plurality of input/output ports for establishing electrical connections between the plurality of input/output ports and the subset of the set of IOs in accordance with the mapping.

In yet another aspect, the present invention features a method for use in an electronic memory repair system comprising an electronic memory having a plurality of input/output ports and a set of IOs, the set of IOs including a plurality of main IOs and a plurality of spare IOs. The method comprises steps of: (A) receiving error data representing the error status of each of the plurality of main IOs; and (B) selecting a mapping between the plurality of input/output ports and a subset of the set of IOs.

In another aspect, the present invention features an electronic memory repair system comprising: an electronic memory comprising a plurality of input/output ports and a set of IOs, the set of IOs including a plurality of main IOs and a plurality of spare IOs; means for receiving error data representing the error status of each of the plurality of main IOs; and selection means for selecting a mapping between the plurality of input/output ports and a subset of the set of IOs.

In yet another aspect, the present invention features a device for use in an electronic memory repair system, the device comprising: receiving means for receiving at least one thermometer code encoding a mapping between a plurality of memory input/output ports and a subset of a set of memory IOs, the set of memory IOs comprising a plurality of main IOs and a plurality of spare IOs; and modifying means for modifying the at least one thermometer code to produce at least one legalized thermometer code.

Other features and advantages of various aspects and embodiments of the present invention will become apparent from the following description and from the claims.

DETAILED DESCRIPTION

In one aspect, the present invention features techniques for generating a repair solution for a memory having a set of IOs including a plurality of main IOs and a plurality of redundant IOs. For example, techniques are provided for selecting a mapping between input/output ports of the memory and a subset of the memory's IOs. In particular, techniques are provided for configuring a plurality of multiplexors to implement the selected mapping by establishing electrical connections between the subset of IOs and the memory input/output ports. The subset of IOs may include one or more of the plurality of redundant IOs which effectively replace one or more defective ones of the main IOs. The plurality of multiplexors may be configured by generating one or more thermometer codes which encode the identities of any defective main IOs and which serve as selection inputs to the plurality of multiplexors.

Figure 1:
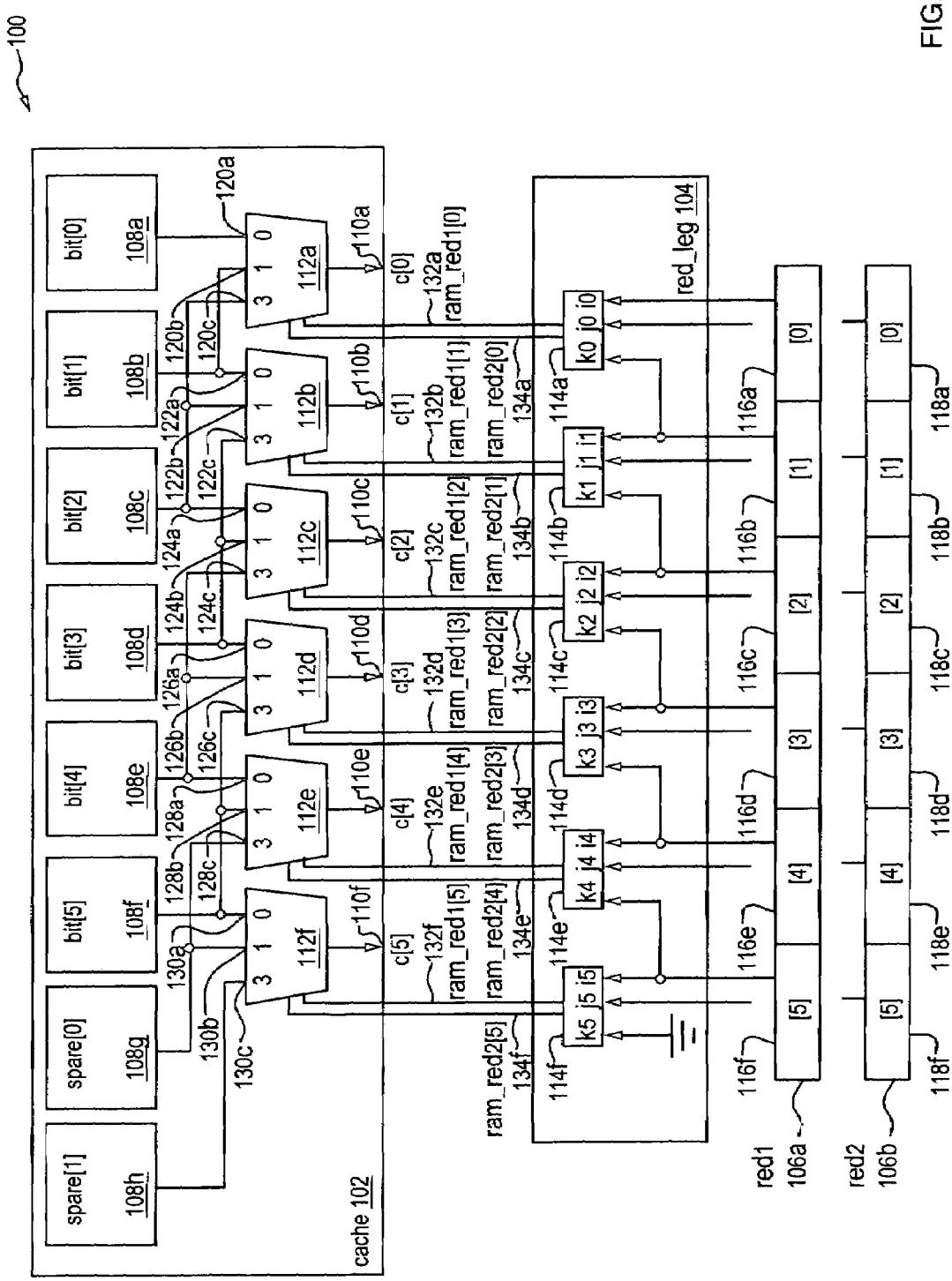
FIG. 1 is schematic diagram of a memory repair system according to one embodiment of the present invention.

Referring to FIG. 1, a schematic diagram of a memory repair system 100 is shown according to one embodiment of the present invention. The system 100 includes a cache memory 102, a redundancy legalization block (red_leg) 104, and two redundancy registers (red1 and red2) 106a-b.

Before describing the operation of the memory repair system 100, the textual and graphical notations used in the following description and drawings will first be explained. Signals are labeled in the drawings using descriptive signal names. The use of a signal name followed by a single index in brackets (such as red1[2]) refers to a single bit of the signal specified by the index, where an index of zero specifies the least significant bit. The use of a signal name followed by an upper and lower index in brackets (such as red1[5:3]) refers to a sequence of signal bits whose indices range from the specified upper index to the specified lower index. The use of a bare signal name (such as red1) refers to the entire signal.

Furthermore, for ease of illustration and to reduce clutter in the drawings, signal paths are only shown where relevant in the drawings, and sub-signals may be illustrated as being disconnected from the corresponding complete signals. Those of ordinary skill in the art will appreciate that conventional techniques may be used to separate signals into sub-signals and to combine sub-signals together to implement the circuitry disclosed herein.

Furthermore, although certain multi-bit signals may be illustrated in the drawings as being transmitted on single lines, it should be appreciated that in practice these signals may be transmitted on busses of appropriate widths and may be further combined or separated onto a lesser or greater number of busses than are illustrated in the drawings.

Referring again to FIG. 1, the cache 102 includes six main IOs of memory 108a-f (labeled bit[5:0]). The cache 102 also includes two redundant (spare) IOs 108g-h that may be used to replace and thereby effectively repair defective ones of the main IOs 108a-f. The cache 102 includes six output ports 110a-f (labeled C[5:0]) through which data are transmitted by the cache 102. Although the cache 102 also includes input ports and corresponding multiplexors, such input ports and multiplexors are not shown in FIG. 1 for ease of illustration and because those of ordinary skill in the art will appreciate how to implement such input ports and multiplexors based on the description provided herein. The term "input/output" port refers herein to any port which is either an input port, an output port, or both an input port and an output port.

Between the cache IOs 108a-h and the cache ports 110a-f is an array of multiplexors 112a-f which connect the cache ports 110a-f to the cache IOs 108a-h. The multiplexors 112a-f may be used to repair as many as two defective ones of the main IOs 108a-f with one or both of the redundant IOs 108g-h, as described in more detail in the above-referenced patent application entitled "A Data-Shifting Scheme for Utilizing Multiple Redundant Elements."

In brief overview, each of the multiplexors 112a-f has three one-bit data inputs and two one-bit selection inputs. In particular, multiplexor 112a has data inputs 120a-c; multiplexor 112b has data inputs 122a-c; multiplexor 112c has data inputs 124a-c; multiplexor 112d has data inputs 126a-c; multiplexor 112e has data inputs 128-c; multiplexor 112f has data inputs 130a-c. The selection inputs of the multiplexors will be described below.

The data inputs of the multiplexors 112a-f are connected to the main cache IOs 108a-f and to the spare cache IOs 108g-h in a manner which allows the multiplexors 112a-f to provide the outputs of the main cache IOs 108a-f directly to the corresponding cache ports 110a-f in the event that none of the main cache IOs 108a-f is defective, and which allows the multiplexors 112a-f to substitute one or both of the spare cache IOs 108g-h for any one or two defective ones of the main cache IOs 108a-f. Although the use of the multiplexors 112a-f to perform this function is described in detail in the above-referenced patent application entitled "A Data-Shifting Scheme for Utilizing Multiple Redundant Elements," the operation of the multiplexors 112a-f will now be described briefly to clarify the discussion that follows.

The three inputs of each of the multiplexors 112a-f are connected, from right to left, to the cache IO directly above the multiplexor and to that cache IO's leftward neighbors. For example, the first data input 120a of multiplexor 112a is coupled to the main cache IO 108a (bit[0]); the second data input 120b of multiplexor 112a is coupled to main cache IO 108b (bit[1]); and the third data input 120c of multiplexor 112a is coupled to main cache IO 108c (bit[2]). In summary if multiplexors 112a-f have indices numbered 0-5, respectively, then for each multiplexor $m_i$ having index i (0≦i<6), the rightmost input of multiplexor $m_i$ is coupled to the cache IO having index i, the center input of multiplexor $m_i$ is coupled to the cache IO having index i+1, and the leftmost input of multiplexor $m_i$ is coupled to the cache IO having index i+2.

Each of the multiplexors 112a-f may select its output from among any of its three data inputs. If none of the main cache IOs 108a-f is defective, each of the multiplexors 112a-f may select its rightmost input, thereby passing through the contents of the main cache IOs 108a f directly to the corresponding cache ports 110a-f. If, however, the main cache IO directly above a particular multiplexor is defective, the multiplexor may select its center input, thereby effectively substituting the defective cache IO with its leftward neighbor. For example, if cache IO 108a is defective and cache IO 108b is not defective, multiplexor 112a may select its center input 120b, thereby bypassing the defective cache IO 108a and replacing it with cache IO 108b. In such a situation the inputs to the remaining multiplexors 112b-f will also need to be adjusted, as described in more detail in the above-referenced patent application entitled "A Data-Shifting Scheme for Utilizing Multiple Redundant Elements." Assuming that only one cache IO is defective, the first spare IO 108g will be selected by multiplexor 112f through its center input 130b.

Now consider an example in which both cache IO 108a and cache IO 108b are defective and the remaining IOs 108c-h are not defective. In this example, multiplexor 112a must select its leftmost input 120c (coupled to cache IO 108c), because its other two inputs 120a-b are coupled to defective IOs 108a-b. More generally, the leftmost input of each of the multiplexors 112a-f selects the cache IO located two bit positions to the left of the multiplexor in the event that both the cache IO directly above the multiplexor and that cache IO's leftward neighbor are defective.

The previous discussion explains how defective ones of the main cache IOs 108a-f may be replaced by the spare IOs 108g-h by selecting appropriate data inputs on the multiplexors 112a-f. To cause the multiplexors 112a-f to re-route non-defective ones of the IOs 108a-h to the ports 110a-f, however, it is necessary to select the appropriate data input on each of the multiplexors 112a-f so that the outputs of only non-defective IOs are routed to the cache ports 110a-f. Techniques that may be used to automatically select appropriate data inputs on each of the multiplexors 112a-f in response to cache IO error data generated by a Built-In Self Test (BIST) engine (not shown) will now be described.

Figure 2:
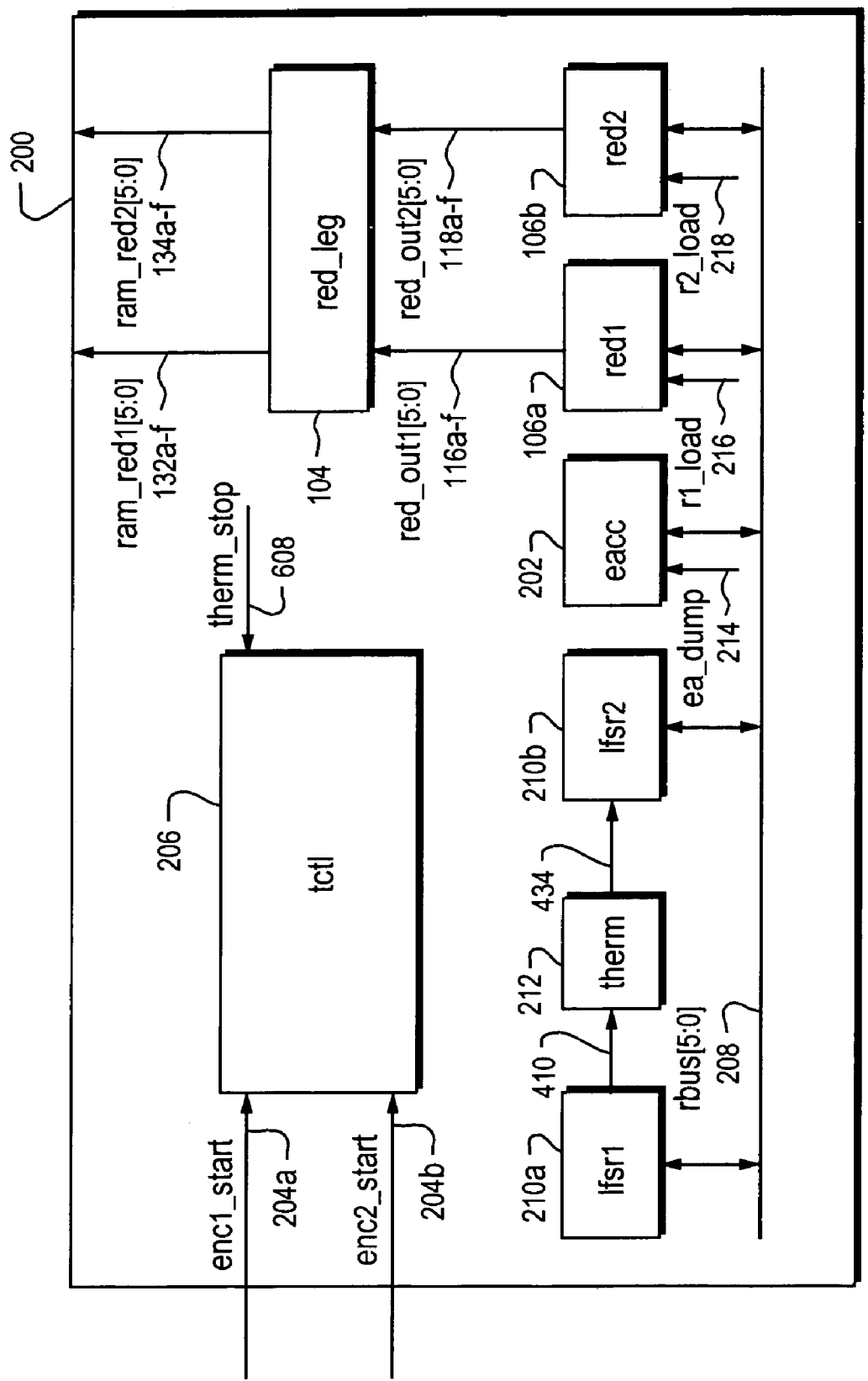
FIG. 2 is a block diagram of a Built-In Self Repair (BISR) engine according to one embodiment of the present invention.

Each of the multiplexors 112a-f is controlled by two selection input wires coupled to a Built-In Self Repair (BISR) engine (FIG. 2). Referring again to FIG. 1, the first redundancy register includes six bits 116a-f and the second redundancy register includes six bits 118a-f. Temporarily ignoring the function performed by the redundancy legalization block 104, each pair of corresponding bits in the two redundancy registers 106a-b forms a two-bit number that is used as the selection input to a corresponding one of the multiplexors 112a-f. For example, bit 116a (red1[0]) and bit 118a (red2[0]) form a two-bit number that is transmitted on a pair of wires as the selection input to corresponding multiplexor 112a. Similarly, bit 116f (red1[5]) and bit 118f (red2[5]) form a two-bit number that is transmitted on a pair of wires as the selection input to corresponding multiplexor 112f.

For each pair of corresponding bits in the first and second redundancy registers 106a-b, the bit from the second redundancy register 106b forms the most-significant bit of the two-bit number and the bit from the first redundancy register forms the least-significant bit of the two-bit number. For example, ram_red2[5] 118f and ram_red1[5] 116f form a two-bit number which selects the input of multiplexor 112f. As indicated in FIG. 1, assume that the rightmost input of each of the multiplexors 112a-f is input 0, the center input is input 1, and the leftmost input is input 3. The input selected by each of the multiplexors 112a-f based on the values of the corresponding bits of the redundancy registers 106a-b is illustrated below in Table 1:

TABLE 1

| ram_red2 | ram_red1 | Selected multiplexor input |
|---|---|---|
| 0 | 0 | 0 |
| 0 | 1 | 1 |
| 1 | 0 | X |
| 1 | 1 | 3 |

As indicated in Table 1, the two-bit number provided as the selection input to one of the multiplexors 112a-f selects the multiplexor data input port associated with that number. In other words, the two-bit selection input 0 (binary 00) selects input 0, the selection input 1 (binary 01) selects input 1, and the selection input 3. (binary 11) selects input 3. Note that the value "X" shown in Table 1 for the two-bit input "10" indicates that "10" is an illegal multiplexor selection input value. As described in more detail below, the redundancy legalization block 104 ensures that this illegal value is never provided as a selection input to any of the multiplexors 112a-f by modifying bits in the redundancy registers 106a-b appropriately.

Based on the description above, it should be apparent that the inputs of the multiplexors 112a-f may be selected by storing appropriate values in the redundancy registers 106a-b. For example, if none of the main cache IOs 108a-f is defective, the binary value 000000 may be stored in each of the redundancy registers 106a-b. Each of the multiplexors 112a-f will thereby receive the binary value 00 as a selection input, in response to which each of the multiplexors 112a-f will select its rightmost input (input zero) as its output, thereby routing each of the main cache IOs 108a-f directly to the corresponding cache ports 110a-f. If only the leftmost main cache IO 108f is defective, the binary value 100000 may be stored in the first redundancy register 106a and the binary value 000000 may be stored in the second redundancy register. This will provide the binary value 00 to each of the multiplexors 112a-e, thereby causing each of them to select its rightmost input and to route the (non-defective) cache IOs 108a-e directly to the corresponding cache ports 110a-e. The leftmost multiplexor 112f, however, will receive the binary value 01 as a selection input, therefore causing it to select its center input 130b and thereby to route the first spare IO 108g (rather than the defective IO 108f) to the cache port 110f.

The codes that are stored in the redundancy registers 106a-b to provide appropriate selection inputs to the multiplexors 112a-f, and thereby to route only non-defective cache IOs to the cache ports 110a-f, are referred to herein as "thermometer codes." Before describing how thermometer codes may be generated and stored in the redundancy registers 106a-b automatically, the thermometer code format will first be described.

The thermometer code stored in the first redundancy register 106a identifies the first defective main cache IO (if any) counting from the right-hand side to the left-hand side of FIG. 1. The thermometer code stored in the second redundancy register 106b identifies the second defective main cache IO (if any) counting leftward from the first defective main cache IO.

In one embodiment of the present invention, the format of the thermometer codes is as follows, assuming a starting condition in which no previous repairs are in effect and in which both the first and second redundancy registers red1 106a and red2 106b contain all zeros. The "effective bit index" of an IO refers herein to the index of the multiplexor to which the IO is currently connected. If, for example, IO 108b (having bit index 1) is coupled to multiplexor 112a as the result of a defect in IO 108a, then IO 108b has an effective bit index of zero.

If the defective IO being encoded by a thermometer code has effective bit index n, then bits zero through n−1 of the thermometer code are equal to zero, and bits n through $n_{MAX}-1$ are equal to one, where $n_{MAX}$ is the number of main cache IOs (six in the present example). For example, if only cache IO 108b (at bit index 1) is defective, the corresponding thermometer code would have the binary value 111110. If only cache IO 108f (at bit index 5) is defective, the corresponding thermometer code would have the binary value 100000. If none of cache IOs 108a-f is defective, the corresponding thermometer code would have the binary value 000000.

Thermometer codes having the same format may be stored in the second redundancy register 106b to indicate that a second one of the main cache IOs 108a-f is defective and to indicate which of the main cache IOs 108a-f is defective. Note, however, that as a result of the repair performed in accordance with the thermometer code stored in the first redundancy register 106a, some or all of the bits of the thermometer code stored in the second redundancy register 106b may be shifted with respect to the main cache IO 108a-f to reflect new effective bit indices of one or more of the main cache IOs 108a-f. For example, a thermometer code of 111110 stored in the first redundancy register 106a and a thermometer code of 110000 stored in the second redundancy register 106b would indicate that the first defective cache IO is IO 108b (bit[1]) and that the second defective cache IO is IO 108f (bit[5]). The second thermometer code (110000) refers to IO 108f (bit[5]) rather than to IO 108e (bit[4]) because IO 108f (bit[5]) has an effective bit index of four after the first repair (resulting from the first thermometer code 111110) is performed.

The preceding discussion described how thermometer codes, once stored in the redundancy registers 106a-b, may be used to repair the cache 102. Techniques that may be employed for generating appropriate thermometer codes and storing them in the redundancy registers 106a-b will now be described.

The cache 102 may include a Built-In Self Test (BIST) engine (not shown) for testing the cache memory. BIST engines are well-known in the art, and a particular BIST engine that may be used in conjunction with the cache 102 is described in commonly-owned U.S. Pat. No. 6,374,370 B1, entitled "Method and System for Flexible Control of BIST Registers Based Upon On-Chip Events," issued on Apr. 16, 2002, hereby incorporated by reference herein.

In general, the BIST engine tests the cache memory array by providing inputs to the cache 102, monitoring the outputs, and determining whether the actual outputs are the same as the expected outputs. The BIST engine may scan the cache memory array many times and test the array using many different input patterns. The BIST engine records any errors that it identifies.

The system 100 may include a Built-In Self Repair (BISR) engine for automatically repairing the cache 102 based on the error data generated by the BIST engine. Referring to FIG. 2, a block diagram is shown of a BISR engine 200 according to one embodiment of the present invention. Some of the registers in the BISR engine 200 (such as the lfsr and eacc registers) may also be components of the cache BIST engine.

Figure 3:
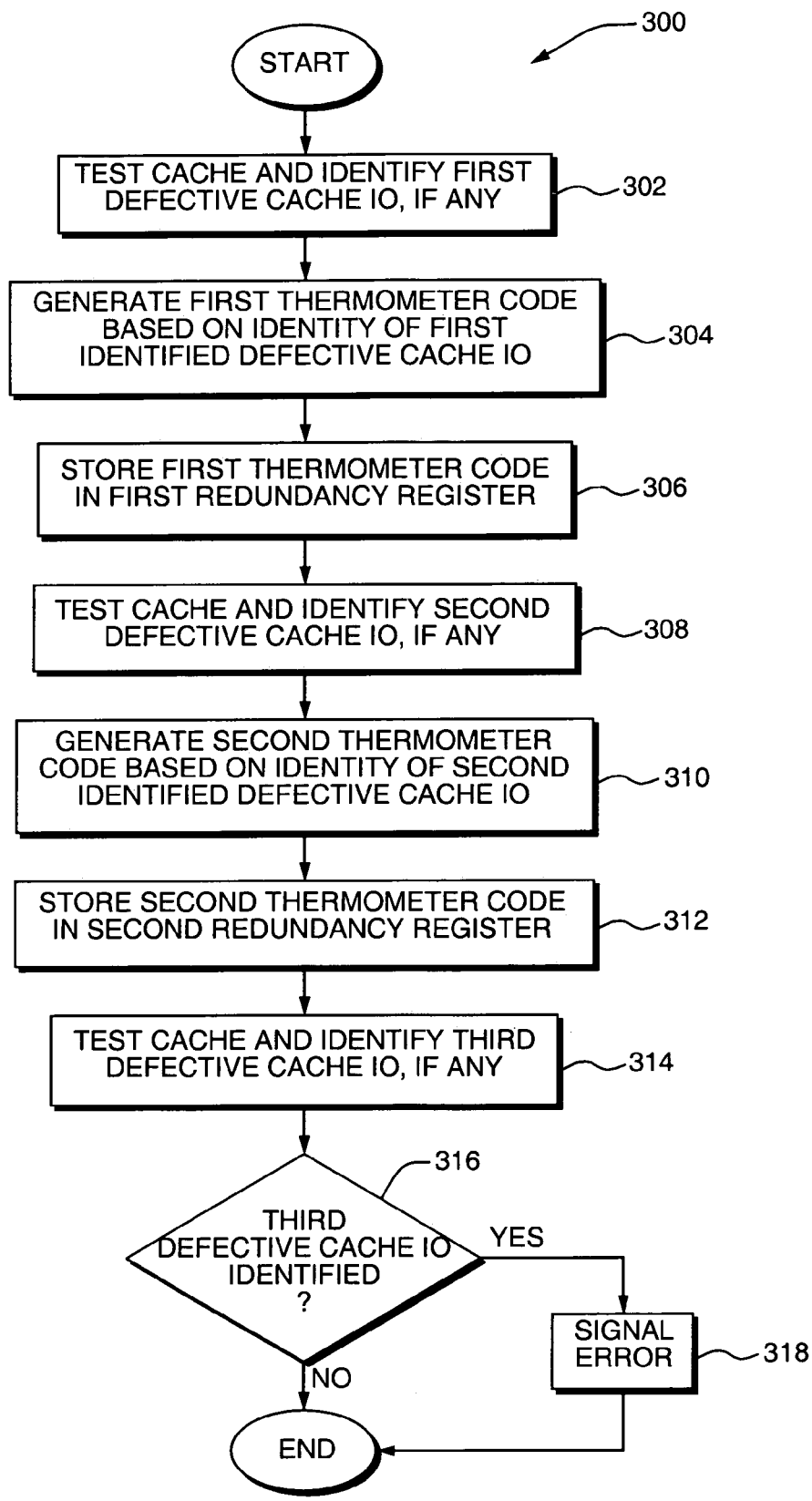
FIG. 3 is a flowchart of a method for testing and repairing a cache having multiple redundant IOs according to one embodiment of the present invention.

Referring to FIG. 3, a flowchart is shown of a method 300 that may be performed by the system 100 to test and repair the cache 102. The BIST engine tests the cache 102 and identifies the first defective cache IO, if any (step 302). The BISR engine 200 generates a first thermometer code based on the identity of the cache IO, if any, identified as defective in step 302 (step 304). The BISR engine 200 stores the first thermometer code in the first redundancy register 106a (step 306). This selects a configuration of the multiplexors 112a-f which routes around the first defective IO (if any), thereby completing a first repair of the cache 102.

The BIST engine tests the cache 102 again and identifies the second defective cache IO, if any (step 308). The BISR engine 200 generates a second thermometer code based on the identity of the cache IO, if any, identified as defective in step 308 (step 310). The BISR engine 200 stores the second thermometer code in the second redundancy register 106b (step 312). This selects a configuration of the multiplexors 112a-f which routes around the second defective IO (if any), thereby completing a second repair of the cache 102.

The BIST engine tests the cache 102 again and identifies the third defective cache IO, if any (step 314). If the BIST engine identifies a third defective cache IO, the repair method 300 signals an error (step 318) because the particular embodiment of the system 100 illustrated in FIG. 1 is limited to repairing two defective cache IOs. In such an event the cache 102 may need to be discarded. If no additional defective cache IOs are identified, the repair method 300 terminates (step 320).

Techniques for implementing the test and repair method 300 will now be described in more detail. To identify the first defective cache IO (step 302) the BIST engine may accumulate error data into the eacc register 202 by storing a one in the bit position of each of the main cache IOs 108a-f, if any, which is defective and a zero in the bit position of each of the main cache IOS 108a-f which is not defective. For example, a one in bit position zero of the eacc register 202 indicates that IO 110a is defective, while a one in bit position five of the eacc register 202 indicates that IO 110f is defective. The binary value 100001 stored in the eacc register 202 would therefore indicate that IOS 110a and 110f are defective and that the remaining IOs 110b-e are not defective. An IO may be considered to be defective if it includes any cells, columns, or rows which cannot be repaired by other means.

Figure 8:
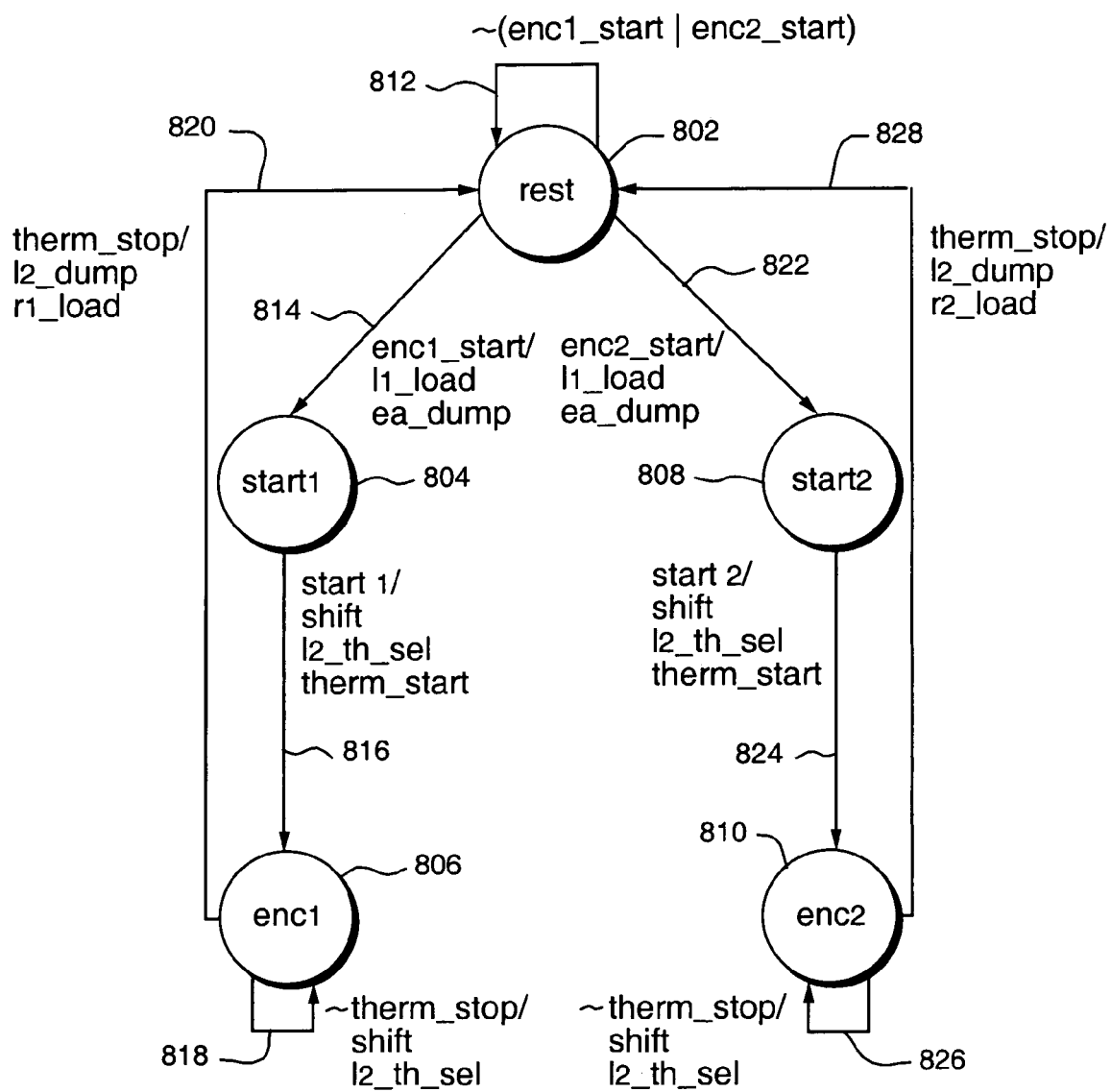
FIG. 8 is a finite state machine diagram illustration the operation of a thermometer control block according to one embodiment of the present invention.

As described in more detail below with respect to FIG. 8, to initiate the generation of the first thermometer code to be generated after the first error data are accumulated into the eacc register 202, the BIST engine transmits a high logical value on the enc1_start input 204a of the thermometer control block (tctl) 206. This causes the first error data to be dumped from the eacc register 202 onto the bus 208 (labeled rbus) and subsequently loaded into a first linear feedback shift register 210a (labeled lfsr1).

As described in more detail below with respect to FIG. 4A, the first error data shifts one bit at a time from register 210a into a thermometer code generation block 212 (labeled therm). As described in more detail below with respect to FIG. 6, the therm block 212 generates the first thermometer code and shifts it one bit at a time into a second linear feedback shift register 210b (labeled lfsr2). The register 210b then contains the first thermometer code.

The first thermometer code is dumped from the second shift register 210b onto the rbus bus 208 and loaded into first redundancy register 106a. This completes the first cache IO repair.

The process just described is then repeated, except that the BIST engine initiates the second encode by transmitting a high logical value on the enc2_start input 204b of the thermometer control block 206. This causes a second thermometer code to be loaded into the second redundancy register 106b rather than the first redundancy register 106a, thereby completing a second cache IO repair.

The preceding general overview of the operation of the BISR engine 200, which does not describe all of the particular control signals that are used to control the cache test and repair process, will be described in more detail below with respect to FIG. 8. First, however, embodiments of elements of the system 100, including elements of the BISR engine 200, will be described in more detail.

Figure 4A:
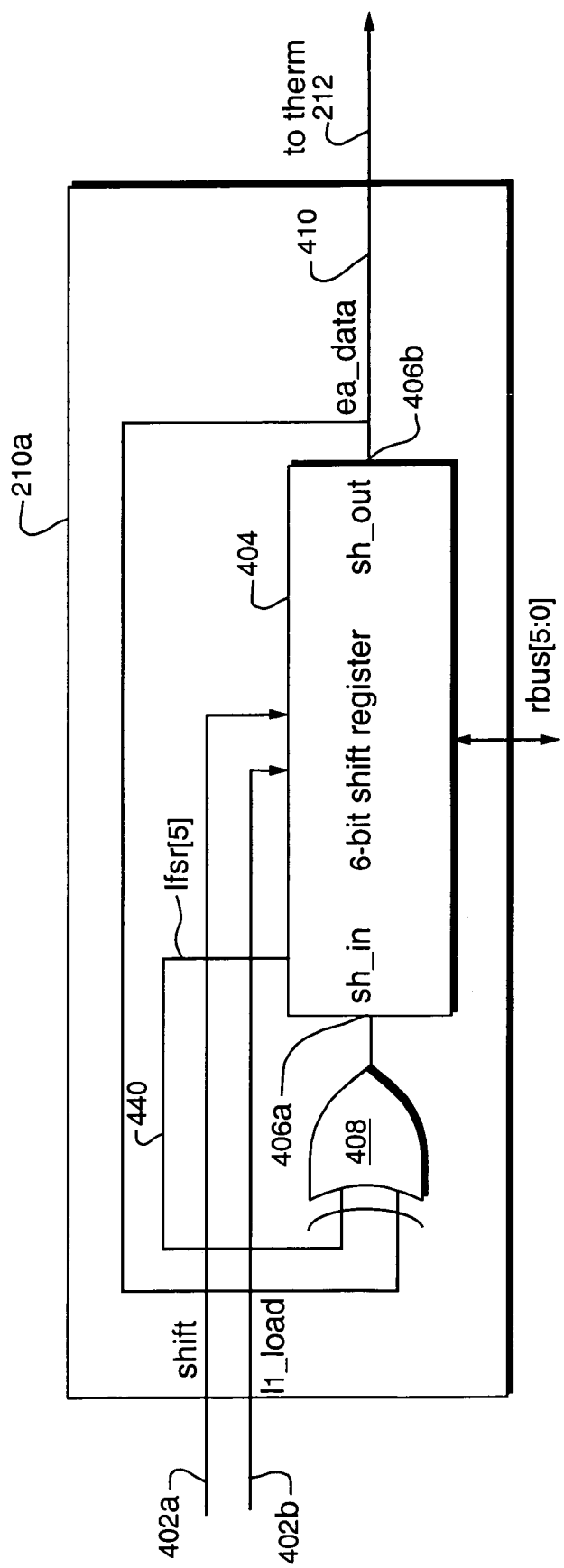
FIGS. 4A-4B are schematic diagrams of the internal circuitry of two linear feedback shift registers according to one embodiment of the present invention.
Figure 4B:
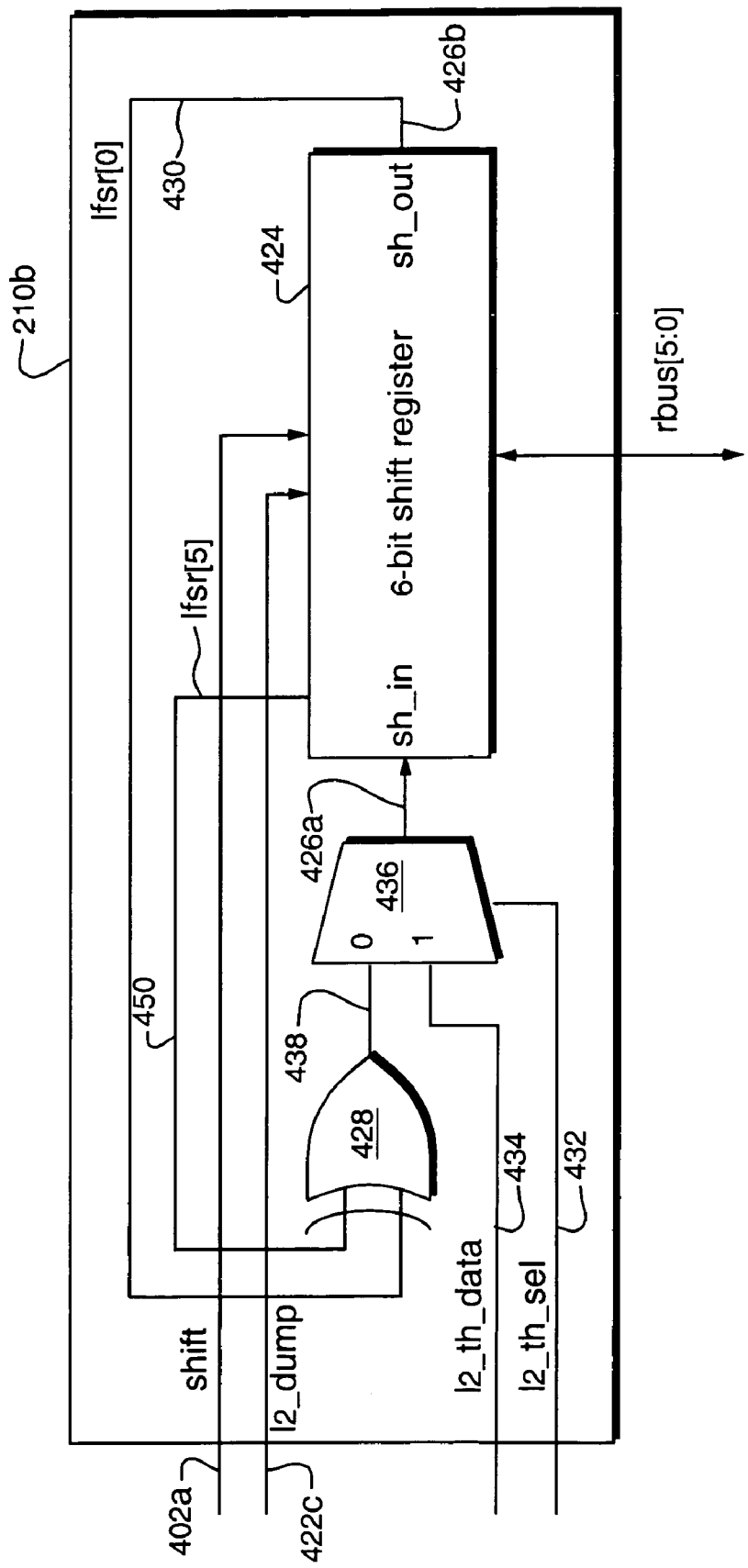

Referring to FIGS. 4A-4B, schematic diagrams of the internal circuitry of the first and second linear feedback shift registers 210a and 210b, respectively, are shown. As is well-known to those of ordinary skill in the art, both registers 210a-b may be used in BIST operations to provide random data for cache testing, as described in more detail in the commonly-owned U.S. Pat. No. 6,374,370 B1, entitled "Method and System for Flexible Control of BIST Registers Based Upon On-Chip Events," issued on Apr. 16, 2002, hereby incorporated by reference herein. In addition, the registers 210a-b may shift error accumulation data through the therm block 212 to generate thermometer codes in accordance with embodiments of the present invention.

Referring to FIG. 4A, operation of the first linear feedback shift register 210a will now be described. The register 210a includes a 6-bit shift register 404 having an input 406a (labeled sh_in) and an output 406b (labeled sh_out). The register 210a has two inputs 402a-b. As described generally above with respect to FIG. 2 and in more detail below with respect to FIG. 8, when the BIST engine asserts a high logical value on the enc1_start input 204a of the thermometer control block 206, the thermometer control block 206 asserts a high logical value on the l1_load input 402b of the register 210a, thereby causing the register 210a to load the contents of the error accumulation register eacc 202 over the bus 208 into the register 404.

Figure 6:
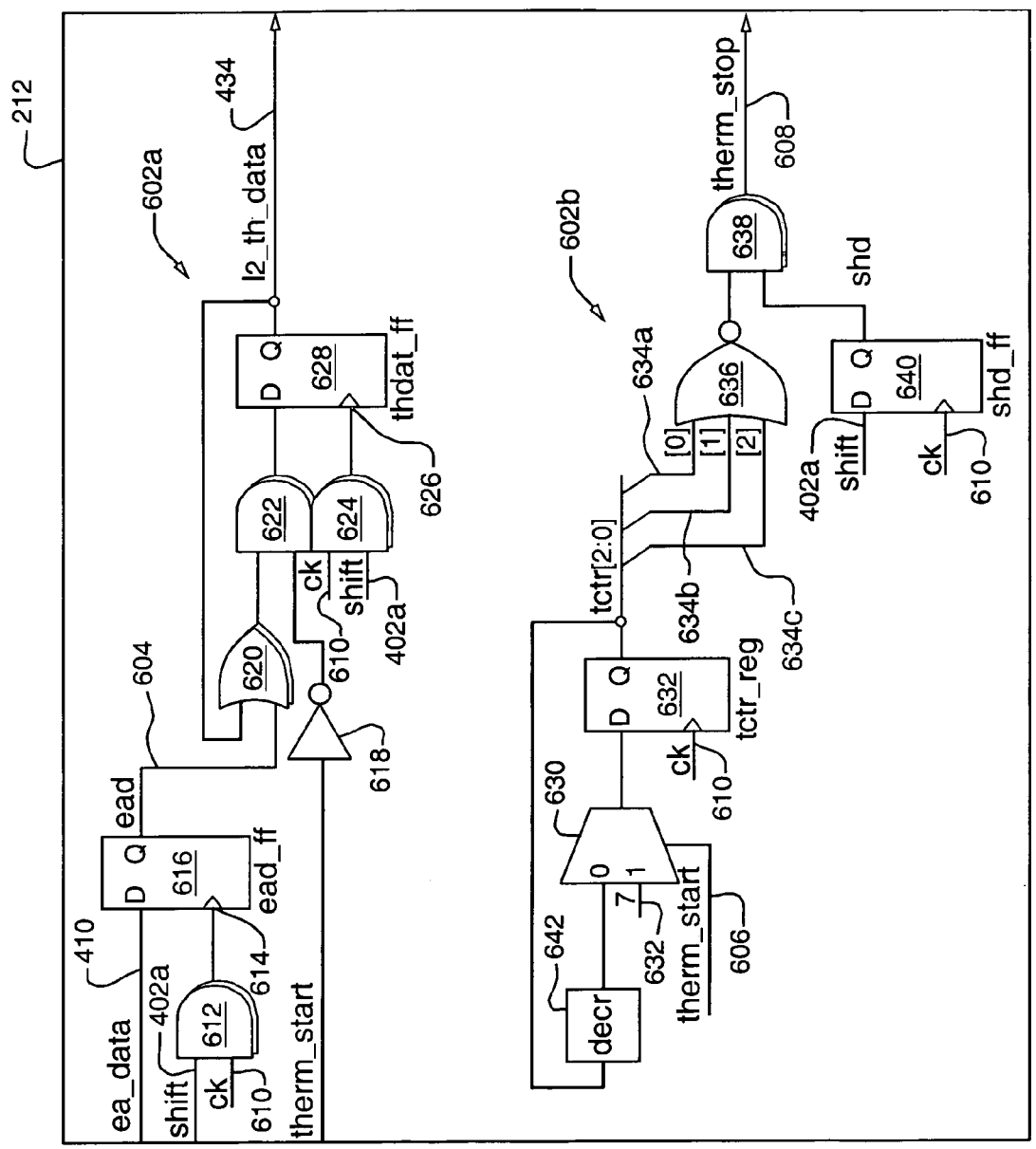
FIG. 6 is a schematic diagram of the internal circuitry of a thermometer code generation block according to one embodiment of the present invention.

When a high logical value is present on the shift input 402a of the register 210a, the contents of the 6-bit shift register 404 shift to the right one bit and a new bit generated by XOR gate 408 shifts into the register 404. The rightmost bit of the shift register 404 is ported out through the sh_out output 406 as error accumulation data 410 (labeled ea_data). The error accumulation data 410 is transmitted one bit at a time as an input to the therm block 212 (FIG. 6).

The purpose of the XOR gate 408 is to generate and store pseudo-random data in the register 404 for cache testing. The XOR gate 408 takes as its two inputs the ea_data 410 output by the shift register 404 and the most significant bit 440 of the shift register 404 on each clock cycle. Each successive output of the XOR gate 408 is shifted in to the sh_in input 406a of the shift register 404 as ea_data 410 is shifted out of the register 404. In this way, the same register 404 may be used both to store pseudo-random data for cache testing and to shift the contents of the error accumulation register eacc 202 into the therm block 212 for thermometer code generation. Alternatively, these two functions may be separated into distinct circuits, in which case the register 210a need not include the XOR gate 408 for purposes of shifting data into the therm block 212.

Referring to FIG. 4B, the operation of the second shift register 210b will now be described in more detail. When a high logical value is present on shift input 402a, the contents of 6-bit shift register 424 shift to the right one bit and a new bit 426a is shifted into the leftmost bit position of the register 424 from one of two sources using a multiplexor 436.

As described in more detail below with respect to FIG. 8, a signal l2_th_sel 432 is provided as the selection input to the multiplexor 436. If l2_th_sel 432 is a high logical value, then the multiplexor 436 selects value of the signal l2_th_data 434 as the input 426a to the 6-bit shift register 424. Otherwise, the multiplexor 436 selects the output 438 of XOR gate 428 as the input 426a to the register 424.

The purpose of the XOR gate 428 is to generate and store pseudo-random data in the register 424 for cache testing. The XOR gate 428 takes as its two inputs the least significant bit 426b shifted out of the register 424 and the most significant bit 450 of the shift register 424 on each clock cycle. Each successive output of the XOR gate 428 is shifted in to shift register 424 on each clock cycle when l2_th_sel 432 is low. In this way, the same register 424 may be used both to store pseudo-random data for cache testing and to store the contents of the thermometer code generated by the therm block 212. Alternatively, these two functions may be separated into distinct circuits, in which case the register 210b need not include the XOR gate 428 for purposes of storing the thermometer code generated by the therm block 212.

Once six bits shift through the register 424 have occurred, the register 424 contains a thermometer code suitable for storage in one of the redundancy registers 106a-b (FIG. 1). When a high logical value is present on the l2_dump signal 422c, the contents of the shift register 424 (i.e., a thermometer code) are driven onto the bus 208 and loaded into the appropriate one of the redundancy registers 106a-b.

Referring to FIG. 6, a schematic diagram is shown of the internal circuitry of the thermometer code generation block therm 212. As described generally above, the therm block 212 generates a thermometer code based on the error accumulation data transferred from the eacc register 202 into the first register 210a.

The therm block 212 includes two sections 602a-b. The upper section 602a is responsible for taking the error accumulation data ea_data 410 received from the first register 210a (FIG. 4A) and producing a thermometer code on the l2_th_data output 434. As described above with respect to FIG. 4B, the l2_th_data output 434 is provided as an input to the second register 210b, which shifts the generated thermometer code over the bus 208 into the appropriate one of the redundancy registers 106a-b.

In overview, the therm block 212 generates a thermometer code as follows. At the initiation of thermometer code generation, the thermometer control block 206 (FIG. 2) asserts a therm_start signal 606, causing l2_th_data 434 to be reset to a logical zero as follows. The therm_start signal 606 is inverted by an inverter 618 to a logical zero which is provided as an input to an AND gate 622, which therefore outputs a zero. The zero output of the AND gate 622 is provided to the D (data) input of a flip-flop 626, which outputs a logical zero on its Q output, thereby resetting l2_th_data 434. The flip-flop 626 is clocked by the output of an AND gate 624 having as inputs the shift signal 402a and a common clock signal clk 610. The flip-flop 628 therefore is triggered only on rising edges of clk 610 during which the shift signal 402a is a logical one.

The error accumulation data ea_data 410 received from the first shift register 210a is clocked bit-by-bit through a flip-flop 616 which is clocked by the output of an AND gate 612 having the shift signal 402a and clock signal clk 610. The flip-flop 616 therefore is triggered only on rising edges of clk 610 during which the shift signal 402a is a logical one. Each bit of ea_data 410 is output on successive clock cycles at the Q output of flip-flop 616.

The l2_th_data signal 434 remains at logical zero until the first logical one is encountered on ead 604, i.e., until the first logical one is encountered in the error accumulation data ea_data 410. The appearance of such a logical one indicates that there is a defective cache IO at the position of the bit of ea_data 410 that is currently stored in ead 604.

When such a logical one is encountered, l2_th_data 434 transitions to logical one and remains at logical one for the remaining clock cycles in the process of shifting ea_data 410 through the therm block 212. To understand how the therm block 212 accomplishes this, consider the first clock cycle in which ead 604 contains a logical one. The ead signal 604 is provided as an input to an OR gate 620, which therefore outputs a logical one as a first input to AND gate 622. The other input of the AND gate 622 is coupled to the output of inverter 618, which always outputs a logical one after the initiation of the thermometer code generation process. As a result, the AND gate 622 outputs a logical one because both of its inputs are a logical one. The output of the AND gate 622 is propagated to l2_th_data 434 through the flip-flop 628.

The l2_th_data signal 434 remains a logical one for the remaining clock cycles in the thermometer code generation process because the l2_th_data signal 434 is fed back to the OR gate 620. Once the l2_th_data signal 434 obtains the value logical one through the process described above, this feedback loop ensures that the OR gate 620 will output a logical one on the next clock cycle, which in turn ensures that l2_th_data signal 434 will have the value of logical one on the next clock cycle, and so on.

The result of the process described above is that l2_th_data 434 will contain logical zeros until the first bit position at which an error is indicated by ead 604 and logical ones beginning at that bit position and thereafter. For example, if ead 604 contains the binary value 000010, then −l2_th_data 434 will contain the binary thermometer code value 111110 upon completion of the thermometer code generation process. If ead 604 contains the binary value 000000, then l2_th_data 434 will contain the binary thermometer code value 000000 upon completion of the thermometer code generation process. If ead 604 contains the binary value 100000, then l2_th_data will contain the binary thermometer code value 100000 upon completion of the thermometer code generation process. In other words, the operation of the upper section 602a generates thermometer codes having the format previously described.

Having described the operation of the upper section 602a of the therm block 212, the lower section 602b of the therm block 212 will now be described. The lower section 602b is a counter whose purpose is to count the six clock cycles necessary to shift all six bits of the error accumulation data ea_data 410 through the upper section 602a to generate a complete thermometer code.

In particular, the lower section 602b implements a counter which begins counting at seven and which decrements on each clock cycle until it reaches zero, at which point the lower section 602b asserts a logical one on a therm=stop output 608, thereby causing the thermometer control block 206 to de-assert the shift signal 402a, which terminates the thermometer code generation process.

More specifically, the lower section 602b includes a multiplexor 630 which receives the therm_start signal 606 as a selection input. When the thermometer control block 206 asserts the therm_start signal 606 to initiate the thermometer code generation process, the therm_start signal 606 causes the multiplexor 630 to select a counter initiation signal 632 which is hardwired to the value seven, thereby resetting the counter implemented by the lower section 602b to seven (i.e., the number of bits to shift plus one).

The output of the multiplexor 630 is a 3-bit value which represents the current value of the counter implemented by the lower section 602b. The current counter value is clocked through a flip-flop by the common clock signal clk 610. The three bits 634a-b of the current counter value are input to a NOR gate 636, which outputs a logical one only when all three of the bits 634a are equal to zero (i.e., when the current value of the counter is equal to zero). The output of NOR gate 636 is provided as a first input to an AND gate 638, which receives as its other input the clocked shift signal 402a. The AND gate 638 therefore outputs a logical zero on therm_stop 608 when the current value of the counter is non-zero (or the value of shift is equal to zero) and outputs a logical one on therm_stop 608 when the current value of the counter is equal to zero and the value of shift 402a is equal to one.

A decrement block 642 decrements the current counter value present at the output of flip-flop 632 and feeds back the decremented counter value to the multiplexor 630. Once the therm block 212 has been initiated, the therm_start signal 606 reverts to a low logical value, thereby causing the multiplexor 630 to provide the output of the decrement block 642 to the flip-flop 632. In this manner, the counter implemented by the lower section 602 is decremented each clock cycle.

In summary, in response to the assertion of the therm_start signal 606 by the thermometer control block 206, the lower section 602b initializes a counter to seven and decrements the counter each clock cycle. During each such clock cycle the upper section 602a shifts one bit of the error accumulation data ea_data 410 into the second shift register 210b. The lower section 602b continues to count downward until the counter reaches zero, at which time the lower section 602b asserts the therm_stop signal 608, thereby causing the thermometer control block 206 to de-assert the shift signal 402a, which in turn causes the lower section 602b to stop counting and the upper section 602a to stop shifting bits of the error accumulation data ea_data 410 to the second shift register 210b.

Figure 7:
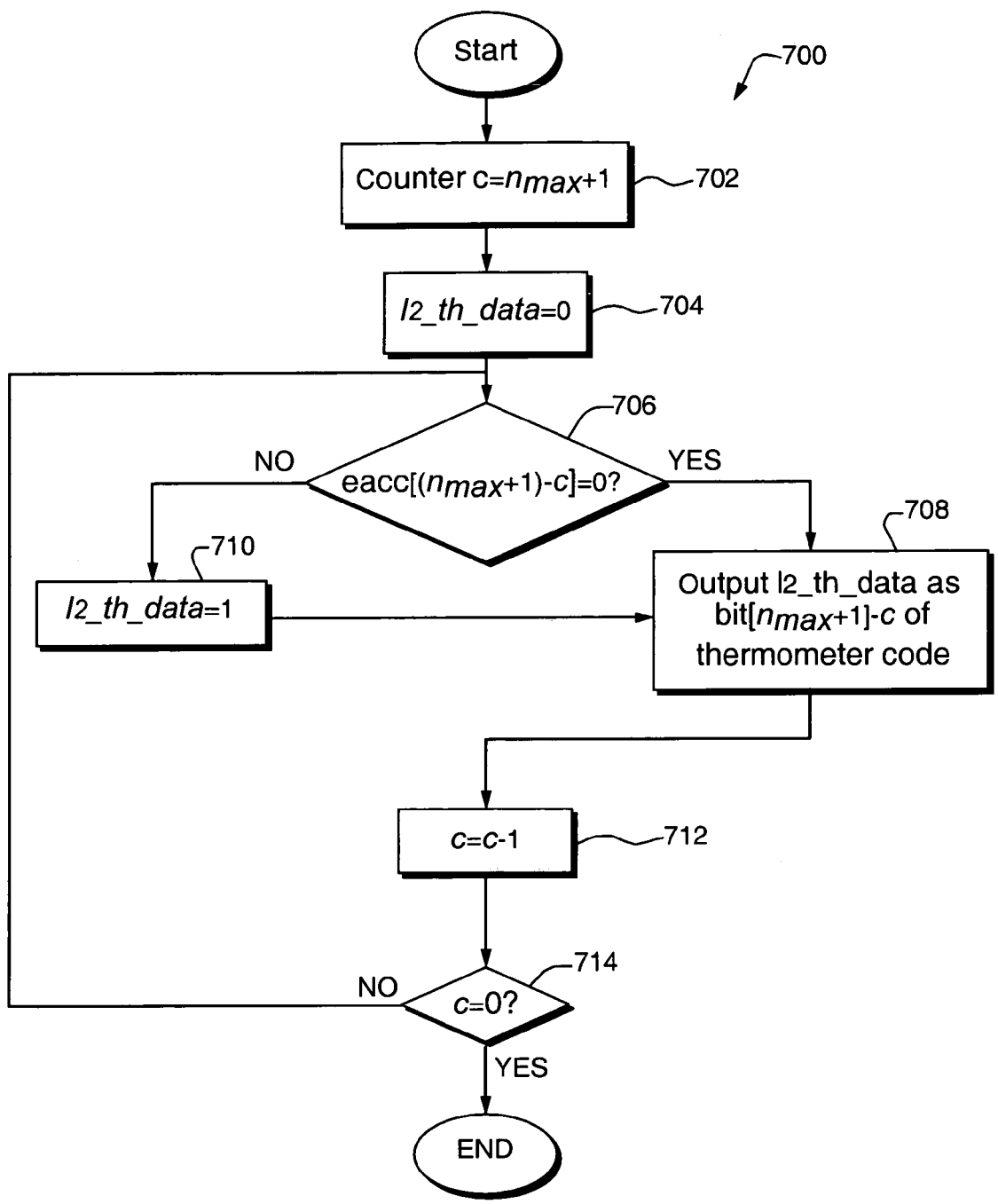
FIG. 7 is a flowchart of a method for generating a thermometer code according to one embodiment of the present invention.

Referring to FIG. 7, a flow chart is shown of a method 700 for generating a thermometer code according to the techniques described above. The method 700 may, for example, implement step 304 of the method 300 illustrated in FIG. 3. In particular, the method 700 illustrates the functions performed by the thermometer code generation block therm 212 in conjunction with the shift registers 210a-b to generate a thermometer code.

The method 700 initializes a counter c to a value of $n_{MAX}+1$, where $n_{MAX}$ is the number of bits in the thermometer code to be generated (e.g., the number of main cache IOs 108a-f in the cache 102) (step 702). For example, as described above with respect to the lower section 602b of the therm block 212 (FIG. 6), the counter c may be initialized to a value of seven using the hardwired signal 632. The method 700 also initializes the value of l2_th_data to zero (step 704). For example, as described above with respect to the upper section 602a of the therm block 212 (FIG. 6), the signal l2_th_data may be initialized to zero when the therm_start signal 606 is provided with a high logical value at the initiation of the thermometer code generation process.

The method 700 determines whether the bit of the error accumulation data eacc 202 at bit position $(n_{MAX}+1)-c$ is equal to zero (step 706). For example, when c is equal to 7, $(n_{MAX}+1)-c$ is equal to 0, when c is equal to 6, $(n_{MAX}+1)-c$ is equal to 1, and when c is equal to 5, $(n_{MAX}+1)-c$ is equal to 2. It should therefore be appreciated that as the counter c decrements from a maximum value of $(n_{MAX}+1)$, the method 700 examines bits in eacc 212 beginning from bit zero and counting upward (i.e., moving from right to left). This is implemented in the system 100 by shifting each bit of ea_data 410 from the register 210a into the therm block 212.

If the bit of the error accumulation data eacc 202 at bit position $(n_{MAX}+1)-c$ is equal to zero, the method 700 outputs the current value of l2_th_data as bit $(n_{MAX}+1)-c$ of the thermometer code (step 708). If, for example, the current value of l2_th_data is zero, then the value zero is output in step 708; if, however, the current value of l2_th_data is one, then the value one is output in step 708. This functionality is primarily implemented using the OR gate 620 (including the feedback loop) in the upper section 602a of the therm block 212, and ensures that the thermometer code output by the therm block 212 contains logical zeros until the first logical one is encountered in the error accumulation data eacc 202.

If the bit of the error accumulation data eacc 202 at bit position $(n_{MAX}+1)-c$ is equal to one, the method 700 assigns a value of one to l2_th_data (step 710) and then outputs the current value of l2_th_data (i.e., one) as bit $(n_{MAX}+1)-c$ of the thermometer code (step 708). This functionality is primarily implemented using the OR gate 620 (including the feedback loop) in the upper section 602a of the therm block 212, and ensures that the thermometer code output by the therm block 212 contains logical ones beginning at the first bit position at which a logical one is encountered in the error accumulation data eacc 202.

The method 700 decrements the counter c (step 712), as implemented by the decrement block 642 in the lower section 602b of the therm block 212. The method 700 determines whether the counter c is equal to zero (step 714), as implemented by the NOR gate 636 in the lower section 602b of the therm block 212. If c is not equal to zero, steps 706-714 are repeated to generate the next bit in the thermometer code. Otherwise, generation of the thermometer code is complete and the method 700 terminates.

Referring again to FIG. 2, the thermometer control block 206 controls the other elements of the BISR entiner 200 to perform cache repair. Referring to FIG. 8, a finite state machine 800 for the thermometer control block tctl 206 (FIG. 2) is illustrated in the form of a state diagram. The state transitions and outputs of the tctl block 206 will now be described with respect to the state diagram 800. Although signal connections between the thermometer control block tctl 206 and other elements of the BISR engine 200 are not illustrated in FIG. 2, those of ordinary skill in the art will appreciate how to implement such connections using the other drawings and the description provided herein.

The state machine 800 starts in a rest state 802 and remains 812 in the rest state 802 until a logical one is received on either enc1_start 204a or enc2_start 204b from the BIST engine. If a logical one is received on enc1_start 204a, the state machine 800 transitions 814 to a start1 state 804 and the outputs l1_load 402b (FIG. 4A) and ea_dump 214 (FIG. 2) are driven to logical one. This causes the contents of the eacc register 202 to be loaded into the 6-bit shift register 404 of lfsr1 210a. The state machine 800 then unconditionally transitions 816 to an enc1 state 806 and the outputs therm_start 610 (FIG. 6), shift 402a (FIGS. 4A-4B and FIG. 6), and l2_th_sel 432 (FIG. 4B) are driven to logical one. This causes the therm block 212 to reset and causes error data ea_data 410 to begin shifting from lfsr1 210a into therm 212. As described above, a thermometer code shifts from therm 212 into lfsr2 210b on each clock cycle that shift 402a is high. The state machine 800 remains 818 in the enc1 state 806 and continues to drive shift 402a and l2_th_sel 432 to logical one, thereby causing the first thermometer code to be generated. The therm_start signal 606, however, returns to logical zero after initially being asserted as a logical one during the transition 816 from the start1 state 804 to the end state 806.

The state machine remains 818 in the end state 806 until a logical one is received on the input therm=stop 608. As described above with respect to FIG. 6, the lower section 602b of the therm block 212 asserts the therm_stop signal 608 when generation of the thermometer code is complete. At this point, the state machine 800 transitions 820 back to the rest state 802 and the outputs l2_dump 422c (FIG. 4B) and r1_load (FIG. 2) are driven to logical one. This causes the first thermometer code that has been created in lfsr2 210b to be loaded into the first redundancy register red1 106a, thereby completing a first cache repair.

The state machine 800 behaves in almost identical fashion with respect to generation of the second thermometer code stored in the second redundancy register 106b. In particular, the machine 800 starts in the rest state 802 and remains 812 in the rest state 802 until a logical one is received on enc2_start 204b from the BIST engine. When a logical one is received on enc2_start 204b, the state machine 800 transitions 814 to a start2 state 808 and the outputs l1_load 402b (FIG. 4B) and ea_dump 214 (FIG. 2) are driven to logical one. This causes the contents of the eacc register 202 to be loaded into the 6-bit shift register 404 of lfsr1 210a. The state machine 800 then unconditionally transitions 824 to an enc2 state 810 and the outputs therm_start 610 (FIG. 6), shift 402a (FIGS. 4A-4B and FIG. 6), and l2_th_sel 432 (FIG. 4B) are driven to logical one. This causes the therm block 212 to reset and causes error data ea_data 410 to begin shifting from lfsr1 210a into therm 212. As described above, a thermometer code shifts from therm 212 into lfsr2 210b on each clock cycle that shift 402a is high. The state machine 800 remains 826 in the enc2 state 810 and continues to drive shift 402a and l2_th_sel 432 to logical one, thereby causing the second thermometer code to be generated. The therm_start signal 606, however, returns to logical zero after initially being asserted as a logical one during the transition 824 from the start2 state 808 to the enc2 state 810.

The state machine 800 remains 826 in the enc2 state 810 until a logical one is received on the input ther_stop 608. At this point, the state machine 800 transitions 828 back to the rest state 802 and the outputs l2_dump 422c (FIG. 4B) and r2_load 218 (FIG. 2) are driven to logical one. This causes the second thermometer code that has been created in lfsr2 210b to be loaded into the second redundancy register red2 106b.

Referring again to FIG. 1, redundancy legalization block 104 includes six redundancy legalization cells 114a-f. As described in more detail below, the redundancy legalization cells 114a-f modify the bit values stored in the redundancy registers 106a-b, if necessary, to ensure that only legal inputs are provided as selection inputs to the multiplexors 112a-f. If the system 100 were otherwise designed to ensure that corresponding bit pairs in the redundancy registers 106a-b never represent illegal multiplexor selection values, the redundancy legalization cells 114a-f would not be necessary.

Each of the redundancy legalization cells 114a-f is connected to corresponding bits of the redundancy registers 106a-b. In particular, each of the redundancy legalization cells 114a-f has three inputs labeled $i_n$, $j_n$, and $k_n$, where n is the bit index of the redundancy legalization cell. The $i_n$ input of each of the redundancy legalization cells 114a-f is connected to bit n of the first redundancy register 106a, and the $j_n$ input of each of the redundancy legalization cells 114a-f is connected to bit n of the second redundancy register 106b. For example, the $i_0$ input of redundancy legalization cell 114a is connected to bit zero of redundancy register 106a, and the $j_0$ input of redundancy legalization cell 114a is connected to bit zero of redundancy register 106b.

The $k_n$ input of each of the redundancy legalization cells 114a-e is connected to bit n+1 of the first redundancy register 106a. For example, the $k_0$ input of redundancy legalization cell 114a is coupled to bit 1 of redundancy register 106a, the $k_1$ input of redundancy legalization cell 114b is coupled to bit 2 of redundancy register 106a, and so on. The $k_5$ input of redundancy legalization cell 114f is connected to ground.

Figure 5A:
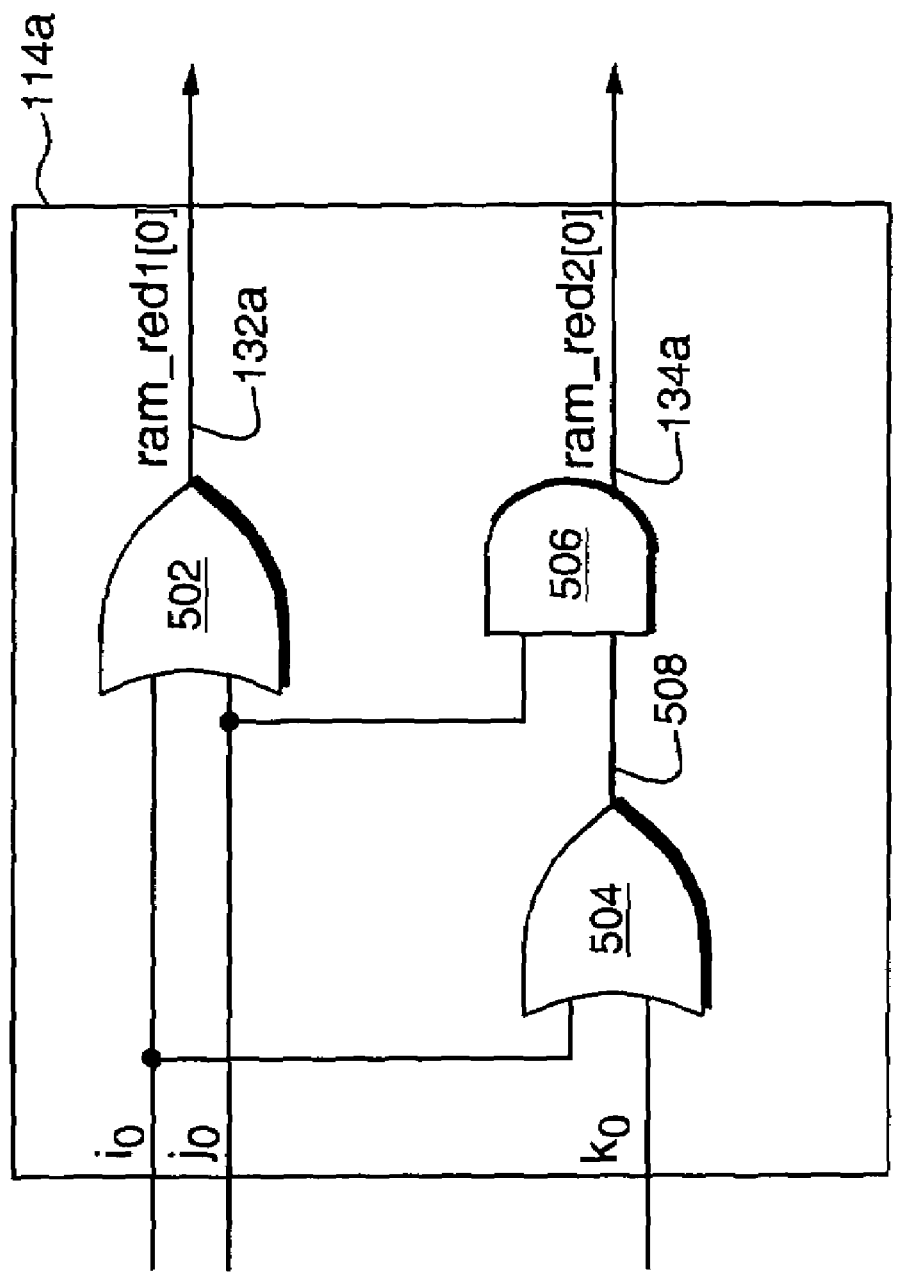
FIG. 5A is a schematic diagram of the internal circuitry of a redundancy legalization cell according to one embodiment of the present invention.

Referring to FIG. 5A, a schematic diagram is shown of the internal circuitry of redundancy legalization cell 114a. It should be appreciated that the other redundancy legalization cells 114b-f may have the same internal circuitry. In general, the combinational logic shown in FIG. 5A generates two outputs ram_red1[0] 502a and ram_red2[0] 502b, which connect to the IO redundancy multiplexor 112a in the cache 102. The outputs ram_red1[0] 502a and ram_red2[0] 502b represent legalized values of red1[0] 116a and red2[0] 118a (FIG. 1), respectively. If red1[0] 116a and red2[0] 118a do not represent an illegal selection input value for the multiplexor 112a, the values of ram_red1[0] 502a and ram_red2[0] 502b will be the same as the values of red1[0] 116a and red2[0] 118a, respectively.

The purpose and operation of the redundancy legalization blocks 114a-f will now be described in more detail. As described above with respect to FIG. 1, there are only three legal selection input values to the multiplexors 112a-f: zero (binary 00), one (binary 01), and three (binary 11). A value of zero selects a multiplexor's rightmost input; a value of one selects the multiplexor's center input; and a value of three selects the multiplexor's leftmost input. The value two (binary 10) is not a legal selection input to the multiplexors 112a-f in the embodiment illustrated in FIG. 1. Providing the binary value 10 as a selection input to one of the multiplexors 112a-f may, for example, cause the multiplexor 112a-f to behave as if it had been provided with a selection value of binary 00 and therefore to produce the wrong result. Therefore it is necessary to ensure that the multiplexors 112a-f are never provided with the binary value 10 as a selection input.

If the memory in the cache 102 and the BIST engine that tests it were perfectly reliable, corresponding bits in the two redundancy registers 106a-b would never form the binary value 10 and there would be no need for the redundancy legalization block 104. It is possible, however, for the techniques described above to produce corresponding bits in the redundancy registers 106a-b which form the binary value 10. The function performed by the redundancy legalization cells 114a-f in the legalization block 104 is to ensure that the binary value 10 is never provided as a selection input to any of the multiplexors 112a-f.

To understand how the illegal binary value 10 may be generated as a selection input to one or more of the multiplexors 112a-f using the techniques disclosed above, recall that the BIST engine tests the cache 102 memory array twice (steps 302 and 308). During the first test, cache IO error information is accumulated into the eacc register 202 and used to generate a thermometer code in the first redundancy register 106a (step 304). If a particular cache IO is only partially faulty, it is possible that the BIST engine will not identify the cache IO as faulty during the first test (i.e., in step 302). The thermometer code that is generated in step 304 and stored in the first redundancy register 106a (step 306) will therefore (incorrectly) contain a zero in the bit position corresponding to the partially faulty cache IO.

It is possible in such a case that the BIST engine will identify the partially faulty cache IO as defective during the second test (step 308), in which case the thermometer code generated in step 310 and stored in the second redundancy register 106b in step 312 will contain a one in the bit position corresponding to the partially faulty cache IO. This will cause the condition described above, in which corresponding bits of the first and second redundancy registers 106a-b form the binary value 10 (decimal 2), which is illegal as a selection input to the multiplexors 112a-f. In such a case it is desirable that the partially defective IO be treated as if it were completely defective and therefore be repaired using the techniques disclosed herein. Providing the values stored in the first and second redundancy registers 106a-b directly to the multiplexors 112a-f will therefore not cause the multiplexors 112a-f to repair the cache 102 properly.

The legalization block 104 modifies the thermometer codes stored in the redundancy registers 106a-b, if necessary, so that the binary value 10 is never provided as a selection input to any of the multiplexors 112a-f. More specifically, the legalization block 104 changes (legalizes) the binary value 10 wherever it occurs in the combination of corresponding bits in the redundancy registers 106a-b into either the binary value 01 or the binary value 11, both of which are legal selection input values to the multiplexors 112a-f. The redundancy legalization cells 114a-f perform the function of modifying any occurrences of the binary value 10 into either binary 01 or binary 11, depending on which modification will cause the corresponding multiplexor to select the correct input.

The operation of the redundancy legalization cells 114a-f to legalize the thermometer codes stored in the redundancy registers 106a-b will now be described according to one embodiment of the present invention. Referring again to FIG. 5A, the internal circuitry of the redundancy legalization cell 114a is shown according to one embodiment of the present invention. As described above with respect to FIG. 1, the redundancy legalization cell 114a includes an input $i_0$ (which receives the value stored in bit zero 116a of the first redundancy register 106a), an input $j_0$ (which receives the value stored in bit zero 118a of the second redundancy register 106b), and an input $k_0$ (which receives the value stored in bit one 116b of the first redundancy register 106a).

A first OR gate 502 produces the ram_red1 signal 132a by performing a logical OR on the $i_0$ input and the $j_0$ input. As a result, the ram_red1 signal 132a is equal to a logical one if either the $i_0$ input or the $j_0$ input is equal to a logical one.

A second OR gate 504 produces an output 508 by performing a logical OR on the $i_0$ input and the $k_0$ input. The output 508 of the second OR gate 504 is provided as an input to an AND gate 506, which produces the ram_red2 signal 132b by performing a logical AND on the $j_0$ input and the output 508 of the first OR gate 504.

Figure 5B:
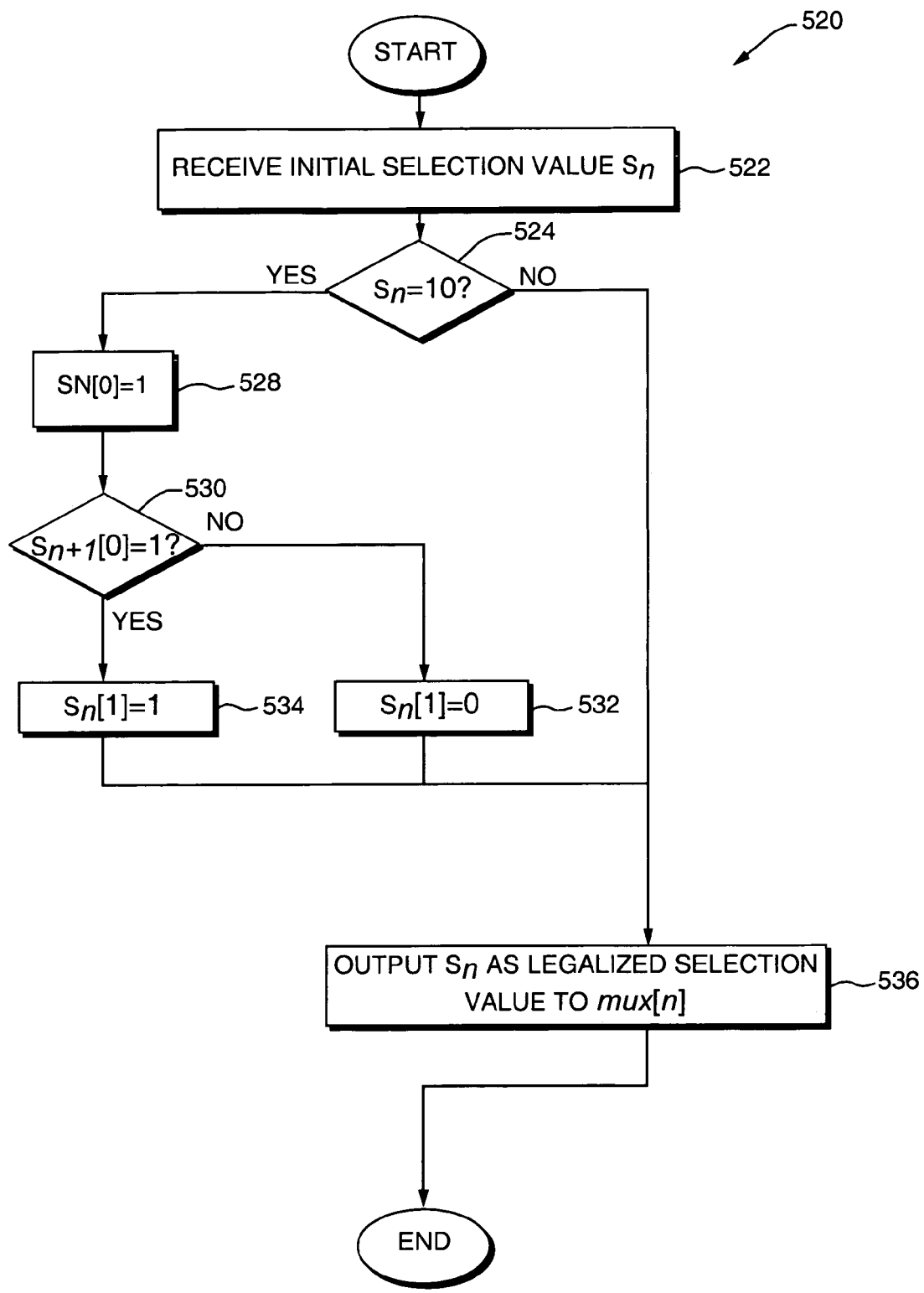
FIG. 5B is a flowchart of a method performed by the redundancy legalization cell of FIG. 5A to legalize an initial selection value according to one embodiment of the present invention.

To understand the operation of the circuitry shown in FIG. 5A and to appreciate how it legalizes the binary value 10 by converting it either into the binary value 01 or the binary value 10, consider now FIG. 5B, which shows a flowchart of a method 520 which represents the functions performed by the circuitry illustrated in FIG. 5A. Although the method 520 legalizes the selection input value provided to multiplexor 112a, the same techniques may be applied to legalize selection values provided to the other multiplexors 112b-f. The method 520 receives two two-bit initial selection values $s_n$ and $s_{n+1}$ (step 522), where n is the bit index of the redundancy legalization cell performing the method 520. For example, n=0 for redundancy legalization cell 114a and n=1 for redundancy legalization cell 114b. The two-bit initial selection value received by the redundancy legalization cell 114a, for example, is the two-bit value formed by red2[0] 118a (on input $j_0$) and red1[0] 116a (on input $i_0$).

The method 520 determines whether the initial selection value $s_n$ is equal to binary 10 (step 524). If the initial selection value $s_n$ is not equal to binary 10, the method 520 outputs the initial selection value $s_n$ as a legalized selection value to the corresponding multiplexor 112a (step 536). In other words, the initial selection value $s_n$ is provided as a selection value to the multiplexor 112a without modification if the initial selection value $s_n$ is any of the legal selection values of binary 00, 01, or 11. This functionality is implemented by the OR gate 502 and AND gate 506 in FIG. 5A.

If the initial selection value $s_n$ is equal to binary 10, the cache IO at bit[0] (i.e., cache IO 108a) is at least partially defective. In such a case, the corresponding multiplexor 112a must select either its center input 120b or its leftmost input 120c to select a non-defective cache IO. Whether the multiplexor 112a should select its center input 120b or its leftmost input 120c depends on whether the cache IO 108b at bit[1] is defective. If the cache IO 108b at bit[1] is not defective, then the multiplexor 112a may select its center input 120b to replace the cache IO 108a with the cache IO 108b; otherwise, the multiplexor 112a must select its leftmost input 120c to replace the cache IO 108a with the cache IO 108c.

Whether the multiplexor 112a selects its center input 120b or its leftmost input 120c, the low bit of the selection value is one, because the low bit of binary 01 (which selects the center input 120b) and the low bit of binary 11 (which selects the leftmost input 120c) is one. The method 520 therefore sets the low bit of the selection value $s_n$ to one (step 528).

Step 528 is implemented by the circuitry illustrated in FIG. 5A as follows. When $s_n$=10, the inputs to the OR gate 502 are 1 and 0. The OR gate 502 therefore outputs a logical one as the value of ram_red1[0] 132a, thereby implementing step 528.

The method 520 determines whether the low bit of the subsequent initial selection value $s_{n+1}$ (e.g., the value of red1[1] 116b, provided at input $k_0$) is equal to one (step 530). Consider, for example, the situation when n=0 and $s_n$=10.

The method 520 determines whether the multiplexor 112a should select its center input 120b or its leftmost input 120c by setting the high bit of the selection value $s_n$ as follows. If the low bit of the subsequent initial selection value $s_{n+1}$ is equal to zero, then the cache IO at bit[n+1] (e.g., cache IO 108b) is not defective, and the multiplexor 112a may replace the cache IO 108a with the cache IO 108b. In such a case the method 520 therefore sets the high bit of the selection value $s_n$ to zero, making the selection value equal to binary 01, and thereby selecting the cache IO 108b through the multiplexor's center input 120b (step 532).

If the low bit of the subsequent initial selection value $s_{n+1}$ is equal to one, then the cache IO at bit[n+1] (e.g., cache IO 108b) is defective, and the multiplexor 112a must replace the cache IO 108a with the cache IO 108c. In such a case the method 520 therefore sets the high bit of the selection value $s_n$ to one, making the selection value equal to binary 11, and thereby selecting the cache IO 108c through the multiplexor's leftmost input 120c (step 534).

Steps 530-534 are implemented by the circuitry illustrated in FIG. 5A as follows. Whenever $s_n$=10, the first input to the OR gate 504 will be zero. The output of the OR gate 504 therefore depends on and is equal to the value of $k_0$, which in this example is the value of red1[1] 116b. The output of the OR gate 504 is connected to the second input of the AND gate 506. The first input of the AND gate 506 receives the value of one when $s_n$=10. The output of the AND gate 506 therefore also depends on and is equal to the value of $k_0$. Because the outputs of both the OR gate 504 and the AND gate 506 are equal to the value of $k_0$, the value of $s_n[1]$ output by the AND gate 506 as ram_red2[0] is equal to the value of $k_0$ whenever $s_n$ is initially equal to 10. The circuitry illustrated in FIG. 5A thereby implements steps 530-534, which assign the value of $k_0$ to $s_n[1]$.

Referring again to FIG. 5B, upon completion of the steps described above, the selection value $s_n$ has been legalized. The method 520 outputs the legalized selection value $s_n$ as a selection input to the multiplexor 112a (step 536). The legalized selection value $s_n$ is thereby guaranteed never to have the binary value of 10 and thereby to provide the multiplexor 112a with a selection value which selects the appropriate one of the cache IOs 108b-c to replace the cache IO 108a.

Among the advantages of the invention are one or more of the following. In one aspect, the present invention advantageously provides techniques for generating a repair solution for caches having multiple redundant IOs. In particular, embodiments of the present invention provide techniques for automatically providing selection inputs to the multiplexors 112a-f in such a way that the multiplexors 112a-f repair as many as two defectives ones of the main cache IOs 108a-f with as many as two of the spare IOs 108g-h. The ability to repair multiple defective cache IOs provides significant advantages over systems which are capable of repairing only a single defective IO, because the ability to repair two defective IOs can make it possible to use a cache with two defective IOs which would otherwise need to be scrapped. Furthermore, the ability to automatically generate a repair solution for up to two defective IOs makes it possible to perform such repair quickly and easily as part of the manufacturing process and even subsequently during normal operation of the cache.

Another advantage of various embodiments of the present invention is that they provide techniques for repairing partially defective IOs. For example, as described above with respect to FIGS. 5A-5B, the legalization block 104 may enable the system 100 to successfully repair IOs which are not consistently identified as defective by the BIST engine. In particular, the legalization block 104 enables up to two defective cache IOs to be repaired so long as each of the two defective IOs is identified as defective in at least one of two test passes. The ability to repair partially defective IOs increases the range of circumstances in which the system 100 may be used to repair the cache 100 and thereby to increase the production yield.

It is to be understood that although the invention has been described above in terms of particular embodiments, the foregoing embodiments are provided as illustrative only, and do not limit or define the scope of the invention. Various other embodiments, including but not limited to the following, are also within the scope of the claims.

Elements and components described herein may be further divided into additional components or joined together to form fewer components for performing the same functions. For example, the linear feedback shift registers 210a-b, therm block 212, and error accumulation register eacc 202 (FIG. 2) may be combined into fewer components or subdivided into a greater number of components for performing the same functions.

Although the cache 102 is illustrated as having six main cache IOs 108a-f, this is not a limitation of the present invention. Rather, the cache 102 may include any number of main cache IOs. Furthermore, although the cache 102 is illustrated as having two spare (redundant) IOs 108g-h, this is not a limitation of the present invention. Rather, the cache 102 may alternatively include three or more spare IOs.

The legalization block 104 may be omitted if other techniques are employed to ensure that the multiplexors 112a-f are always provided with legal selection inputs or if other techniques are employed to ensure that the multiplexors 112a-f behave appropriately in response to the thermometer codes stored in the redundancy registers 106a-b. Furthermore, although the inputs of the multiplexors 112a-f are numbered using the decimal numbers 0, 1, and 3, this is not a limitation of the present invention. Rather, the inputs of the multiplexors may alternatively be numbered using other numbering schemes.

What is claimed is:

1. A method for use in an electronic memory repair system comprising an electronic memory having a plurality of input/output ports and a set of IOs, the set of IOs including a plurality of main IOs and a plurality of spare IOs, the method comprising steps of:
(A) receiving error data representing the error status of each of the plurality of main IOs;
(B) selecting a mapping between the plurality of input/output ports and a subset of the set of IOs, comprising steps of:
(B)(1) generating a first thermometer code encoding a first portion of the mapping; and
(B)(2) generating a second thermometer code encoding a second portion of the mapping, wherein the first and second thermometer codes in combination encode selection inputs to a plurality of multiplexors coupled between the set of IOs and the plurality of input/output ports for establishing electrical connections between the plurality of input/output ports and the subset of the set of IOs in accordance with the mapping; and
(C) establishing electrical connections between the plurality of input/output ports and the subset of the set of IOs in accordance with the mapping selected in step (B).

2. A device for use in an electronic memory repair system, the device comprising:
receiving means for receiving at least one thermometer code encoding a mapping between a plurality of memory input/output ports and a subset of a set of memory IOs, the set of memory IOs comprising a plurality of main IOs and a plurality of spare IOs; and
modifying means for modifying the at least one thermometer code to produce at least one legalized thermometer code.

3. The device of claim 2, wherein the modifying means comprises a plurality of redundancy legalization cells, and wherein each of the redundancy legalization cells comprises:
means for receiving a portion of the at least one thermometer code;
means determining whether the portion of the at least one thermometer code represents a legal selection input value to a multiplexor coupled to the device;
means for modifying the at least one thermometer code to produce the at least one legalized thermometer code if it is determined that the portion of the at least one thermometer code does not represent a legal selection input value; and
means for providing the portion of the at least one thermometer code as the at least one legalized thermometer code if it is determined that the portion of the at least one thermometer code represents a legal selection input value.

4. The device of claim 3, wherein the at least one thermometer code comprises first and second thermometer codes, and wherein the means for receiving a portion of the at least one thermometer code comprises means for receiving a first portion of a the first thermometer code and a second portion of the second thermometer code.

5. The device of claim 4, wherein the first portion comprises a first bit of the first thermometer code, wherein the second portion comprises a second bit and a third bit of the second thermometer code, and wherein the device comprises:
first input means for receiving the first bit;
second input means for receiving the second bit;
third input means for receiving the third bit;
a first OR gate coupled to first and second input means to produce a first legalized output bit;
a second OR gate coupled to the first and third input means to produce an intermediary output; and
an AND gate coupled to the second input means and the intermediary output to produce a second legalized output bit;

wherein the legalized thermometer code comprises the first and second legalized output bits.

6. A method for repairing an electronic memory, the electronic memory comprising a plurality of input/output ports and a set of IOs, the set of IOs including a plurality of main IOs and a plurality of spare IOs, the method comprising steps of:
 (A) loading first error data into error data storage means;
 (B) generating a first thermometer code encoding a first portion of a mapping between the plurality of input/output ports and a subset of the set of IOs;
 (C) storing the first thermometer code in first thermometer code storage means;
 (D) loading second error data into the error data storage means;
 (E) generating a second thermometer code encoding a second portion of the mapping between the plurality of input/output ports and the subset of the set of IOs; and
 (F) storing the second thermometer code in second thermometer code storage means.

7. The method of claim 6, wherein the subset of the set of IOs comprises at least one of the spare IOs and fewer than all of the main IOs.

8. The method of claim 6, wherein the subset of the set of IOs comprises two of the spare IOs.

9. The method of claim 6, further comprising a step of:
 (G) providing the first and second thermometer codes to switching means for establishing electrical connections between the plurality of input/output ports and the subset of the set of IOs in accordance with the mapping.

10. A system comprising:
 an electronic memory comprising a plurality of input/output ports and a set of IOs, the set of IOs including a plurality of main IOs and a plurality of spare IOs;
 means for loading first error data into error data storage means;
 means for generating a first thermometer code encoding a first portion of a mapping between the plurality of input/output ports and a subset of the set of IOs;
 means for storing the first thermometer code in first thermometer code storage means;
 means for loading second error data into the error data storage means;
 means for generating a second thermometer code encoding a second portion of the mapping between the plurality of input/output ports and the subset of the set of IOs; and
 means for storing the second thermometer code in second thermometer code storage means.

11. The system of claim 10, wherein the subset of the set of IOs comprises at least one of the spare IOs and fewer than all of the main IOs.

12. The method of claim 11, wherein the subset of the set of IOs comprises two of the spare IOs.

13. The system of claim 11, further comprising:
 means for providing the first and second thermometer codes to switching means for establishing electrical connections between the plurality of input/output ports and the subset of the set of IOs in accordance with the mapping.

* * * * *

UNITED STATES PATENT AND TRADEMARK OFFICE
CERTIFICATE OF CORRECTION

PATENT NO. : 7,328,378 B2 Page 1 of 1
APPLICATION NO. : 11/507272
DATED : February 5, 2008
INVENTOR(S) : Warren Kurt Howlett It is certified that error appears in the above-identified patent and that said Letters Patent is hereby corrected as shown below:

In column 5, line 39, delete "108a f" and insert -- 108a–f --, therefor.

In column 14, line 49, delete "therm=stop" and insert -- therm_stop --, therefor.

In column 15, line 18, delete "ther_stop" and insert -- therm_stop --, therefor.

In column 17, line 49, delete "s," and insert -- $s_n$ --, therefor.

Signed and Sealed this

Tenth Day of June, 2008

JON W. DUDAS
*Director of the United States Patent and Trademark Office*